(12) United States Patent
Subas Chandra Bose

(10) Patent No.: US 12,550,664 B2
(45) Date of Patent: Feb. 10, 2026

(54) STANDARD BASE COMPONENTS FOR FORMING INBOARD AND OUTBOARD SUBSTRATE HANDLING CHAMBERS AND THEIR USE IN PRODUCTION OF SUBSTRATE PROCESSING SYSTEMS WITH EXPANDED PRODUCTION CAPACITY

(71) Applicant: ASM IP Holding B.V., Almere (NL)

(72) Inventor: Senthil Arasu Subas Chandra Bose, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/900,014

(22) Filed: Sep. 27, 2024

(65) Prior Publication Data
US 2025/0112061 A1    Apr. 3, 2025

Related U.S. Application Data

(60) Provisional application No. 63/586,140, filed on Sep. 28, 2023.

(51) Int. Cl.
*H01L 21/67* (2006.01)
(52) U.S. Cl.
CPC .............................. *H01L 21/67196* (2013.01)
(58) Field of Classification Search
CPC ......... H01L 21/67196; H01L 21/67167; H01L 21/67184; B23C 3/00
See application file for complete search history.

(56) References Cited

U.S. PATENT DOCUMENTS

| | | | |
|---|---|---|---|
| 6,092,981 A | 7/2000 | Pfeiffer | |
| 6,216,328 B1 | 4/2001 | Boyd et al. | |
| 6,305,565 B1 | 10/2001 | Boyd | |
| 6,530,733 B2 | 3/2003 | Klein | |
| 6,943,122 B2 | 9/2005 | Powell | |
| 7,018,517 B2 | 3/2006 | Kurita | |
| 7,207,766 B2 | 4/2007 | Kurita | |
| 7,717,481 B2 | 5/2010 | Ng | |
| 8,399,809 B1 | 3/2013 | Bourez | |
| 9,349,620 B2 | 5/2016 | Kamata | |
| 10,153,187 B2 | 12/2018 | Thirunavukarasu | |
| 10,504,762 B2 | 12/2019 | Parathithasan | |

(Continued)

FOREIGN PATENT DOCUMENTS

| | | |
|---|---|---|
| CN | 218631937 U | 3/2023 |
| KR | 20050030506 A | 3/2005 |

(Continued)

*Primary Examiner* — Lee A Holly
(74) *Attorney, Agent, or Firm* — Banner & Witcoff, Ltd.

(57) ABSTRACT

Substrate processing systems and methods have expanded substrate processing capabilities. For such systems, substrate handling chamber bodies of different styles and for different areas of the substrate processing system may be formed using a standard substrate handling chamber precursor. Such substrate handling chamber precursors may include an exterior shape most of which can be used for two (or more) different styles of substrate handling chamber bodies. During milling, the standard precursors can be milled in different ways and by removing different amounts of material to form substrate handling chamber bodies having different numbers of facets, with different shapes, and for different locations in a substrate processing system.

17 Claims, 9 Drawing Sheets

(56) References Cited

U.S. PATENT DOCUMENTS

Figure 1:
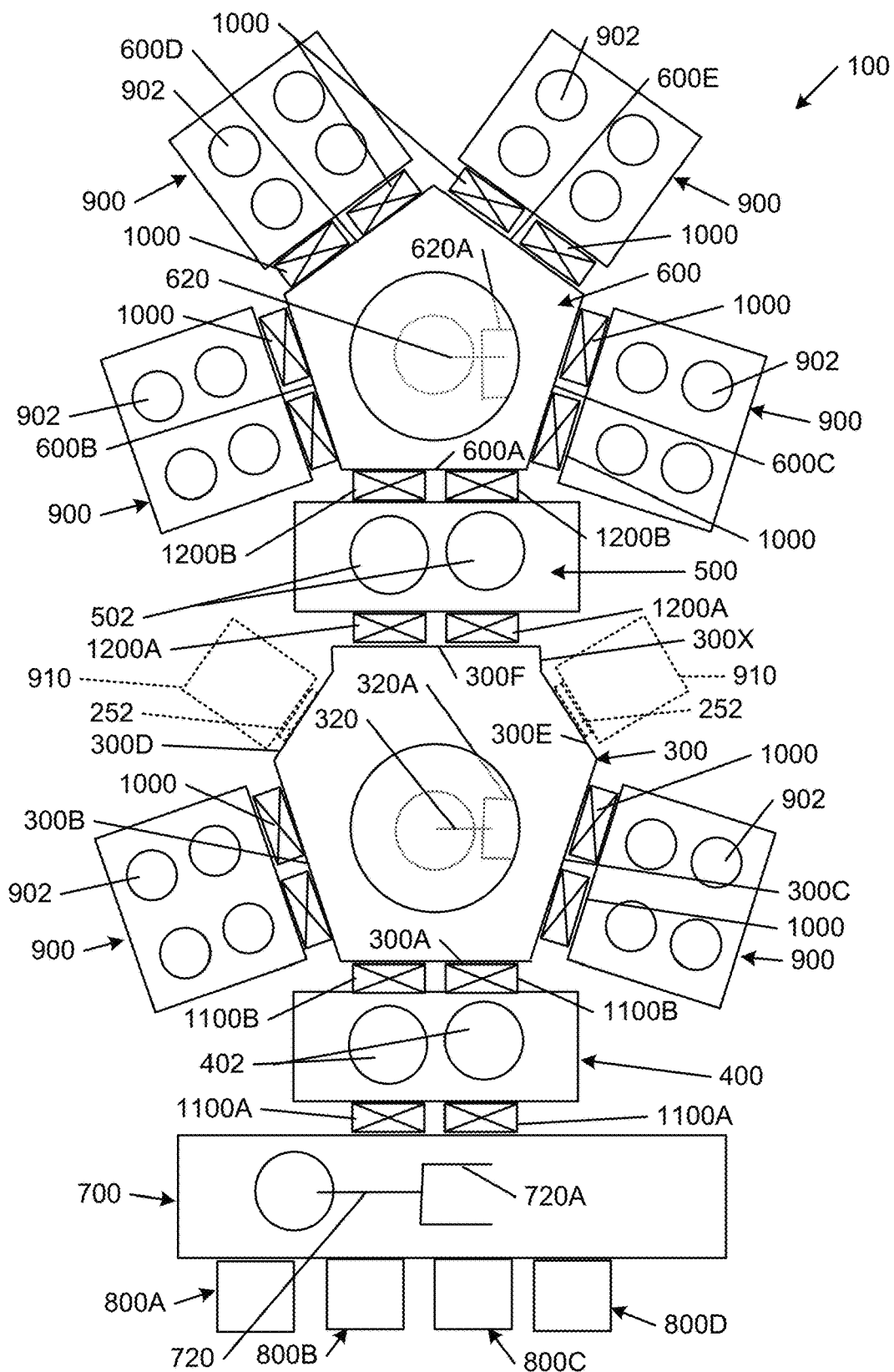

| | | |
|---|---|---|
| 10,566,226 B2 | 2/2020 | Thirunavukarasu |
| 10,699,931 B2 | 6/2020 | Chen et al. |
| 11,211,266 B2 | 12/2021 | Balares |
| 11,557,500 B2 | 1/2023 | Parkhe |
| 2001/0014266 A1 | 8/2001 | Toshima |
| 2004/0033125 A1 | 2/2004 | Gomez |
| 2004/0081547 A1 | 4/2004 | Suh |
| 2004/0113444 A1 | 6/2004 | Blonigan |
| 2005/0133158 A1 | 6/2005 | Nguyen |
| 2006/0101728 A1 | 5/2006 | White |
| 2006/0201074 A1 | 9/2006 | Kurita |
| 2006/0288936 A1 | 12/2006 | Jiang |
| 2007/0141748 A1 | 6/2007 | Rice |
| 2007/0274809 A1 | 11/2007 | Kao |
| 2008/0019806 A1 | 1/2008 | Myo |
| 2014/0271055 A1 | 9/2014 | Weaver et al. |
| 2016/0240405 A1 | 8/2016 | Francischetti |
| 2017/0183775 A1 | 6/2017 | Yamamoto |
| 2017/0352562 A1 | 12/2017 | Kurita |
| 2018/0190535 A1 | 7/2018 | Weaver |
| 2018/0254207 A1 | 9/2018 | Assaf |
| 2019/0105748 A1 | 4/2019 | Lambe |
| 2019/0326146 A1 | 10/2019 | Thirunavukarasu |
| 2019/0348264 A1 | 11/2019 | Tsai |
| 2021/0020476 A1 | 1/2021 | Harbert |
| 2021/0111051 A1 | 4/2021 | Senoue |
| 2021/0143034 A1 | 5/2021 | Rice |
| 2021/0272825 A1 | 9/2021 | Rice |
| 2021/0296146 A1 | 9/2021 | Blanchard |
| 2022/0199436 A1 | 6/2022 | Merry |
| 2023/0022174 A1 | 1/2023 | Kobayashi et al. |
| 2023/0142778 A1 | 5/2023 | Lo |
| 2023/0143667 A1 | 5/2023 | Nerwal |
| 2023/0215709 A1* | 7/2023 | Miao .................. H01J 37/3288 118/719 |
| 2023/0235428 A1 | 7/2023 | Aguilar Santillan |
| 2023/0413448 A1 | 12/2023 | Rice |
| 2024/0213056 A1* | 6/2024 | Sico .................. H01L 21/67742 |
| 2024/0262741 A1 | 8/2024 | Kim |

FOREIGN PATENT DOCUMENTS

| | | |
|---|---|---|
| TW | I438829 B | 5/2014 |
| TW | 201913861 A | 4/2019 |
| WO | 1999027566 A1 | 6/1999 |
| WO | 2006130811 A2 | 12/2006 |

* cited by examiner

STANDARD BASE COMPONENTS FOR FORMING INBOARD AND OUTBOARD SUBSTRATE HANDLING CHAMBERS AND THEIR USE IN PRODUCTION OF SUBSTRATE PROCESSING SYSTEMS WITH EXPANDED PRODUCTION CAPACITY

CROSS-REFERENCE TO RELATED APPLICATION(S)

This application claims the benefit of U.S. Provisional Application 63/586,140 filed on Sep. 28, 2023, the entire contents of which are incorporated herein by reference.

FIELD OF THE DISCLOSURE

The present disclosure relates generally to substrate processing systems having expanded substrate processing capabilities. Some more particular aspects of this technology relate to substrate handling chamber precursors that can be used to make two (or more) different styles of substrate handling chamber bodies. Still additional aspects of this technology relate to methods of making substrate handling chamber bodies of different styles and for different areas of a substrate processing system using a standard substrate handling chamber precursor.

BACKGROUND OF THE DISCLOSURE

Material layers are commonly deposited onto substrates during fabrication of semiconductor devices, such as during fabrication of integrated circuits and electronic devices. Material layer deposition generally is accomplished by supporting a substrate within a substrate processing chamber arrangement, heating the substrate to a desired deposition temperature, and flowing one or more material layer precursor gases through the chamber arrangement and across the substrate. As the precursor gas flows across the substrate, the material layer progressively develops onto the surface of the substrate, typically according to the temperature of the substrate and environmental conditions within the chamber arrangement.

In a cluster type semiconductor vacuum processing tool, multiple substrate processing chambers may be coupled with a single substrate handling chamber that moves substrates into and out of the substrate processing chambers and into and out of the overall substrate processing system. Such systems allow multiple substrates to be processed simultaneously using some common equipment.

Conventional semiconductor production systems and methods generally have been acceptable for their intended purpose, but there is room for improvement. For example, additional ways of improving production efficiency, increasing throughput, reducing costs, and/or simplifying production processes would be welcome advances in the art.

SUMMARY OF THE DISCLOSURE

Aspects of this technology relate to substrate processing systems and methods having expanded substrate processing capabilities. Some more particular aspects of this technology relate to substrate handling chamber precursors that can be used to make two (or more) different styles of substrate handling chamber bodies. Additional aspects of this technology relate to methods of making substrate handling chamber bodies of different styles and for different areas of a substrate processing system using a standard substrate handling chamber precursor.

Substrate handling chamber precursors in accordance with at least some examples of this technology include one or more of: (a) a main body portion including a first major surface, a second major surface opposite the first major surface, and multiple facets forming sidewalls extending between the first major surface and the second major surface; (b) a projection extending from the second major surface and in a direction away from the first major surface, wherein the main body portion and the projection are formed as a single, one-piece, forged component part; (c) a first recess extending inward from the first major surface, the first recess including a bottom surface; and/or (d) a through hole opening extending from the bottom surface of the first recess through the projection.

In addition to one or more of the features described above, or as an alternative, in at least some examples of this technology, the projection will comprise a round cylindrical structure extending from the second major surface.

In addition to one or more of the features described above, or as an alternative, in at least some examples of this technology, the first recess will define a circular perimeter having a first diameter and the through hole opening will define a circular perimeter having a second diameter, wherein the second diameter is less than one half the first diameter.

In addition to one or more of the features described above, or as an alternative, in at least some examples of this technology, the multiple facets forming the sidewalls of the main body portion will form a hexagonal shape.

In addition to one or more of the features described above, or as an alternative, in at least some examples of this technology, the multiple facets will include: (a) a first facet, (b) a second facet extending from the first facet at a first angle, (c) a third facet extending from the first facet at a second angle, (d) a fourth facet extending from the second facet at a third angle, (e) a fifth facet extending from the third facet at a fourth angle, and (f) a sixth facet extending between the fourth facet and the fifth facet.

In addition to one or more of the features described above, or as an alternative, in at least some examples of this technology, the second angle will be substantially equal to the first angle and/or the third angle will be substantially equal to the fourth angle.

In addition to one or more of the features described above, or as an alternative, in at least some examples of this technology, the third angle will be at least 30 degrees larger than the first angle.

In addition to one or more of the features described above, or as an alternative, in at least some examples of this technology, the sixth facet will extend from the fourth facet at a fifth angle and the sixth facet will extend from the fifth facet at a sixth angle, wherein the fifth angle is substantially equal to the sixth angle.

In addition to one or more of the features described above, or as an alternative, in at least some examples of this technology, the third angle will be at least 30 degrees larger than the first angle and/or at least 30 degrees larger than the fifth angle.

In addition to one or more of the features described above, or as an alternative, in at least some examples of this technology, each of the first facet and the sixth facet will be wider than each of the second facet, the third facet, the fourth facet, and the fifth facet.

In addition to one or more of the features described above, or as an alternative, in at least some examples of this technology, each of the first facet, the second facet, the third facet, and the sixth facet will at least 1.3 times wider than each of the fourth facet and the fifth facet.

Methods of manufacturing substrate handling chambers in accordance with at least some examples of this technology may comprise one or more of: (a) providing a first substrate handling chamber precursor and a second substrate handling chamber precursor, the first substrate handling chamber precursor having a first set of dimensions and the second substrate handling chamber precursor having a second set of dimensions that are substantially equal to corresponding dimensions of the first set of dimensions such that the first substrate handling chamber precursor and the second substrate handling chamber precursor are substantially equivalent in size and shape; (b) machining the first substrate handling chamber precursor to remove a first amount of material from the first substrate handling chamber precursor to form a first substrate handling chamber body, wherein the first substrate handling chamber body includes a first exterior perimeter shape having a first number of facets located around and forming first sidewalls of the first substrate handling chamber body; and (c) machining the second substrate handling chamber precursor to remove a second amount of material from the second substrate handling chamber precursor to form a second substrate handling chamber body, wherein the second substrate handling chamber body includes a second exterior perimeter shape having a second number of facets located around and forming second sidewalls of the second substrate handling chamber body, wherein the second number of facets is less than the first number of facets, and wherein the second amount of material is greater than the first amount of material.

In addition to one or more of the features described above, or as an alternative, in at least some examples of this technology, each of the first substrate handling chamber precursor and the second substrate handling chamber precursor will have a main body portion including a first major surface, a second major surface opposite the first major surface, and multiple facets forming sidewalls extending between the first major surface and the second major surface.

In addition to one or more of the features described above, or as an alternative, in at least some examples of this technology, each of the first substrate handling chamber precursor and the second substrate handling chamber precursor further may include a projection extending from the second major surface and in a direction away from the first major surface, wherein the main body portion and the projection are formed as a single, one-piece, forged component part.

In addition to one or more of the features described above, or as an alternative, in at least some examples of this technology, each of the first substrate handling chamber precursor and the second substrate handling chamber precursor further may include a first recess extending inward from the first major surface, the first recess including a bottom surface.

In addition to one or more of the features described above, or as an alternative, in at least some examples of this technology, each of the first substrate handling chamber precursor and the second substrate handling chamber precursor further may include a through hole opening extending from the bottom surface of the first recess through the projection.

In addition to one or more of the features described above, or as an alternative, in at least some examples of this technology, the first recess will define a circular perimeter having a first diameter and the through hole opening will define a circular perimeter having a second diameter, wherein the second diameter is less than one half the first diameter.

In addition to one or more of the features described above, or as an alternative, in at least some examples of this technology, the projection of each of the first substrate handling chamber precursor and the second substrate handling chamber precursor comprises a round cylindrical structure extending from the second major surface.

In addition to one or more of the features described above, or as an alternative, in at least some examples of this technology, the first number of facets forming the first sidewalls of the first substrate handling chamber body comprises at least six facets, and/or the second number of facets forming the second sidewalls of the second substrate handling chamber body comprises no more than five facets.

In addition to one or more of the features described above, or as an alternative, in at least some examples of this technology, each of the first substrate handling chamber precursor and the second substrate handling chamber precursor includes: (a) a first facet, (b) a second facet extending from the first facet at a first angle, (c) a third facet extending from the first facet at a second angle, (d) a fourth facet extending from the second facet at a third angle, (e) a fifth facet extending from the third facet at a fourth angle, and (f) a sixth facet extending between the fourth facet and the fifth facet.

In addition to one or more of the features described above, or as an alternative, in at least some examples of this technology, the second angle will be substantially equal to the first angle and/or the third angle will be substantially equal to the fourth angle.

In addition to one or more of the features described above, or as an alternative, in at least some examples of this technology, the sixth facet will extend from the fourth facet at a fifth angle and/or the sixth facet will extend from the fifth facet at a sixth angle, wherein the fifth angle is substantially equal to the sixth angle.

In addition to one or more of the features described above, or as an alternative, in at least some examples of this technology, the third angle will be at least 30 degrees larger than the first angle and/or at least 30 degrees larger than the fifth angle.

In addition to one or more of the features described above, or as an alternative, in at least some examples of this technology, each of the first facet and the sixth facet will be wider than each of the second facet, the third facet, the fourth facet, and the fifth facet.

In addition to one or more of the features described above, or as an alternative, in at least some examples of this technology, each of the first facet, the second facet, the third facet, and the sixth facet will be at least 1.3 times wider than each of the fourth facet and the fifth facet.

In addition to one or more of the features described above, or as an alternative, in at least some examples of this technology, the first substrate handling chamber precursor and the second substrate handling chamber precursor are provided as part of an inventory of precursors provided for forming multiple substrate handling chamber bodies, wherein each precursor of the inventory includes a set of dimensions that are substantially equal to corresponding dimensions of the first set of dimensions such that all precursors in the inventory have substantially equivalent sizes and shapes.

In addition to one or more of the features described above, or as an alternative, in at least some examples of this technology: (i) the first substrate handling chamber body is formed to include: (a) a first top surface, (b) a first bottom surface located opposite the first top surface, and (c) a first chamber extending inward from the first top surface, and wherein the method further comprises: engaging a first lid with the first substrate handling chamber body, wherein the first lid is sized, shaped, and movably positionable to cover a first opening to the first chamber at the first top surface; and/or (ii) the second substrate handling chamber body is formed to include: (a) a second top surface, (b) a second bottom surface located opposite the second top surface, and (c) a second chamber extending inward from the second top surface, and wherein the method further comprises: engaging a second lid with the second substrate handling chamber body, wherein the second lid is sized, shaped, and movably positionable to cover a second opening to the second chamber at the second top surface.

In addition to one or more of the features described above, or as an alternative, in at least some examples of this technology: (i) the first substrate handling chamber body is formed to include: (a) a first top surface, (b) a first bottom surface located opposite the first top surface, (c) a first chamber extending inward from the first top surface to a first interior bottom face, and (d) a first through hole opening extending from the first interior bottom face to the first bottom surface, and wherein the method further comprises: placing a first substrate transfer robot in the first chamber such that a first portion of the first substrate transfer robot extends into the first through hole opening below the first interior bottom face; and/or (ii) the second substrate handling chamber body is formed to include: (a) a second top surface, (b) a second bottom surface located opposite the second top surface, (c) a second chamber extending inward from the second top surface to a second interior bottom face, and (d) a second through hole opening extending from the second interior bottom face to the second bottom surface, and wherein the method further comprises: placing a second substrate transfer robot in the second chamber such that a second portion of the second substrate transfer robot extends into the second through hole opening below the second interior bottom face.

This summary is provided to introduce a selection of concepts relating to this technology in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 3A:
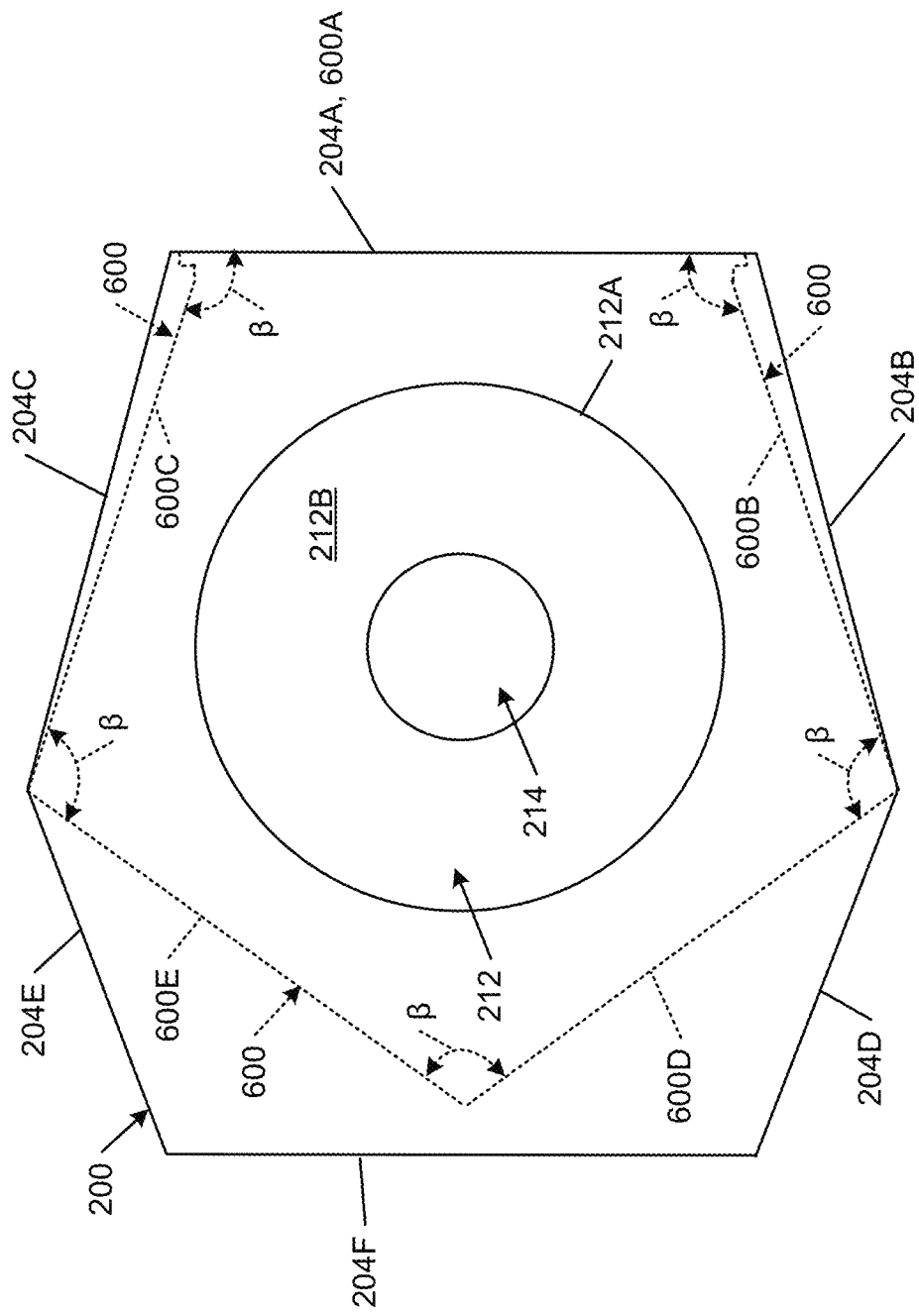
Figure 3B:
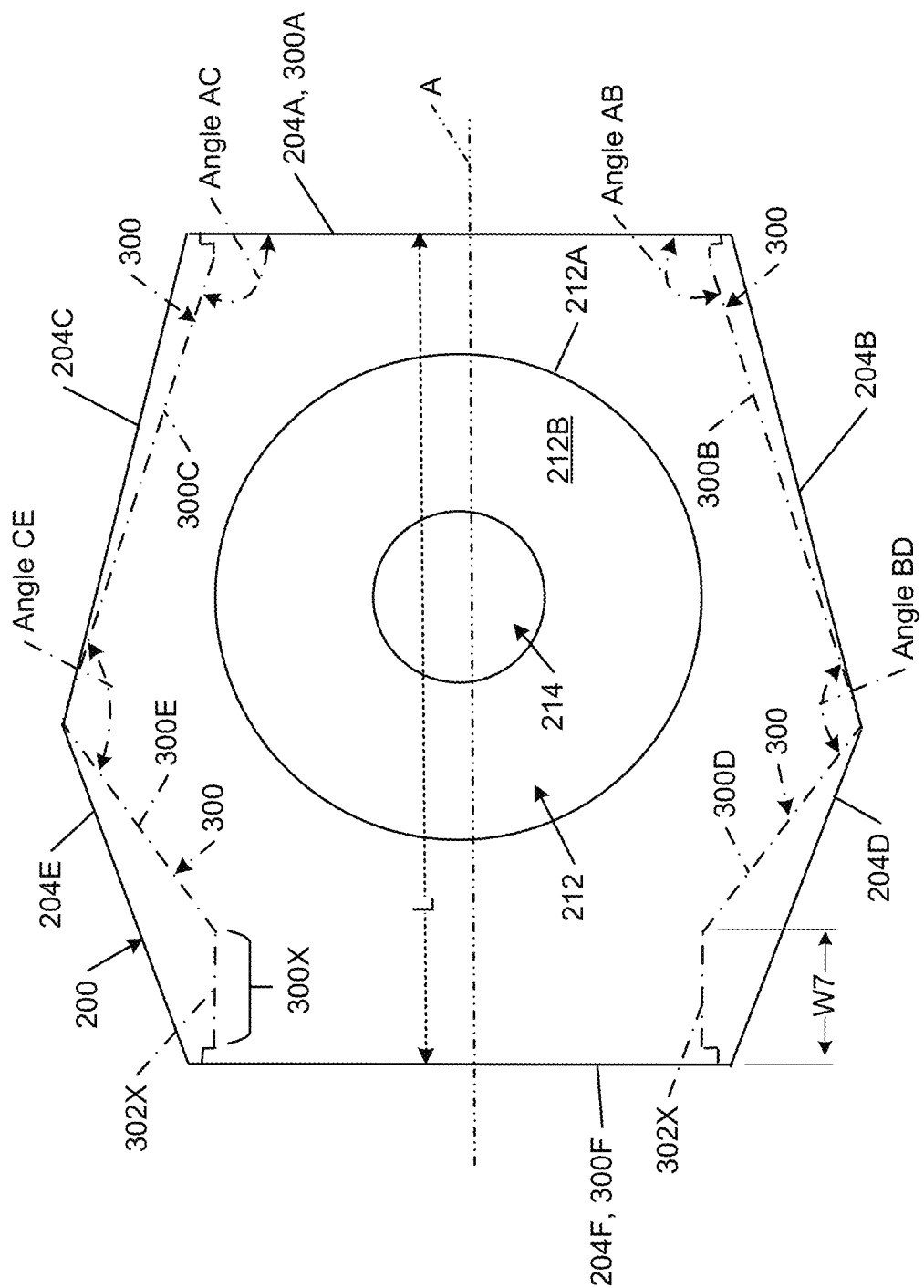
Figure 3C:
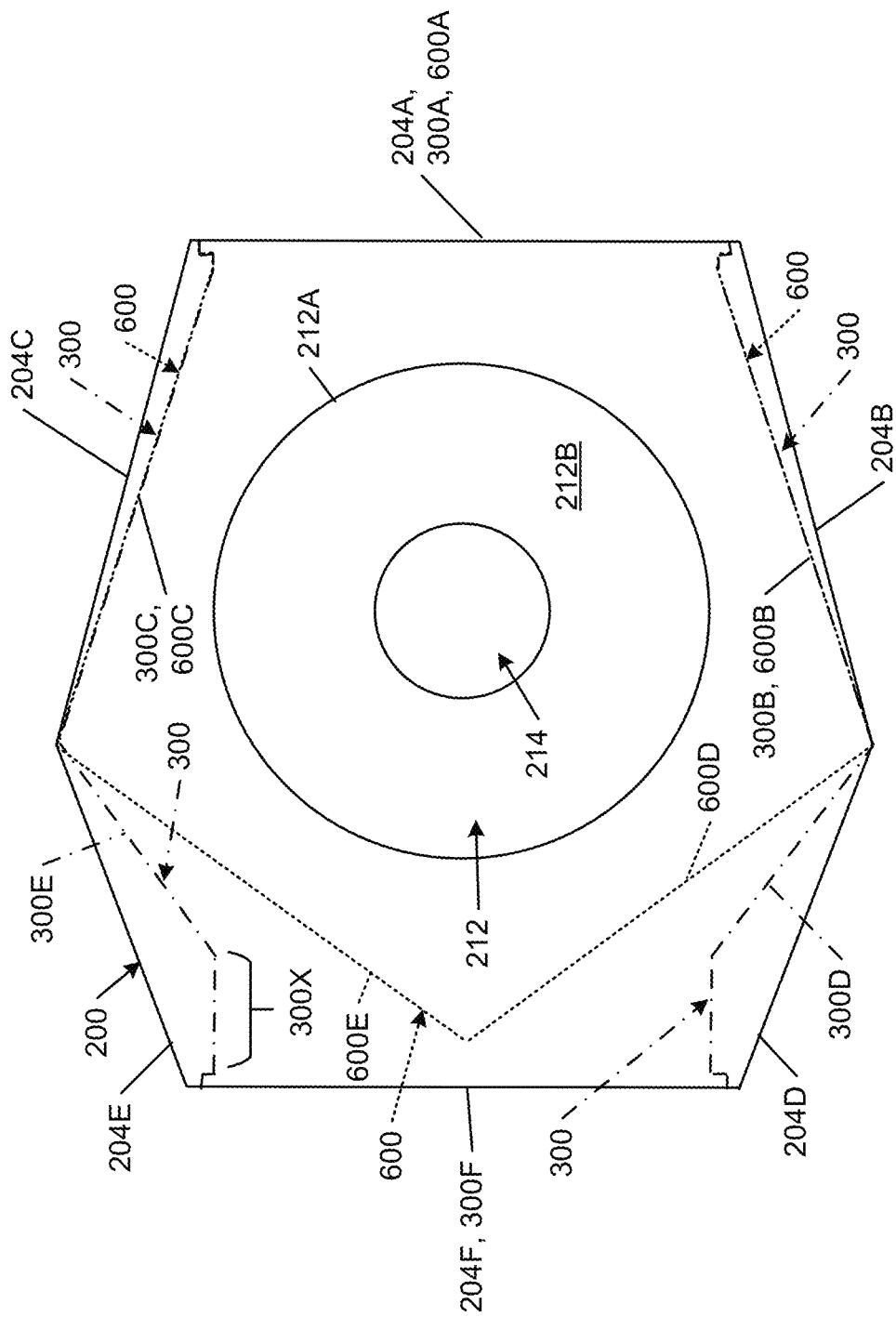
Figure 4A:
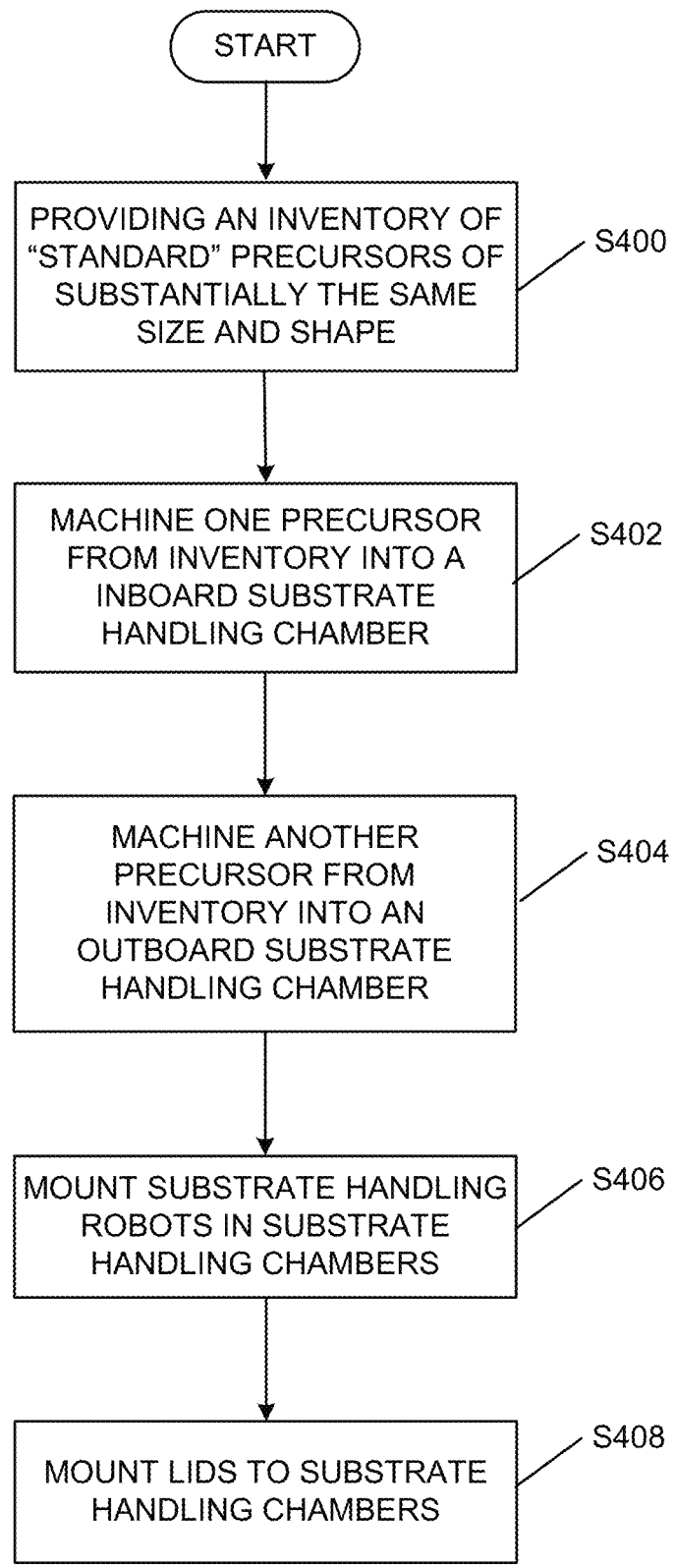
Figure 4B:
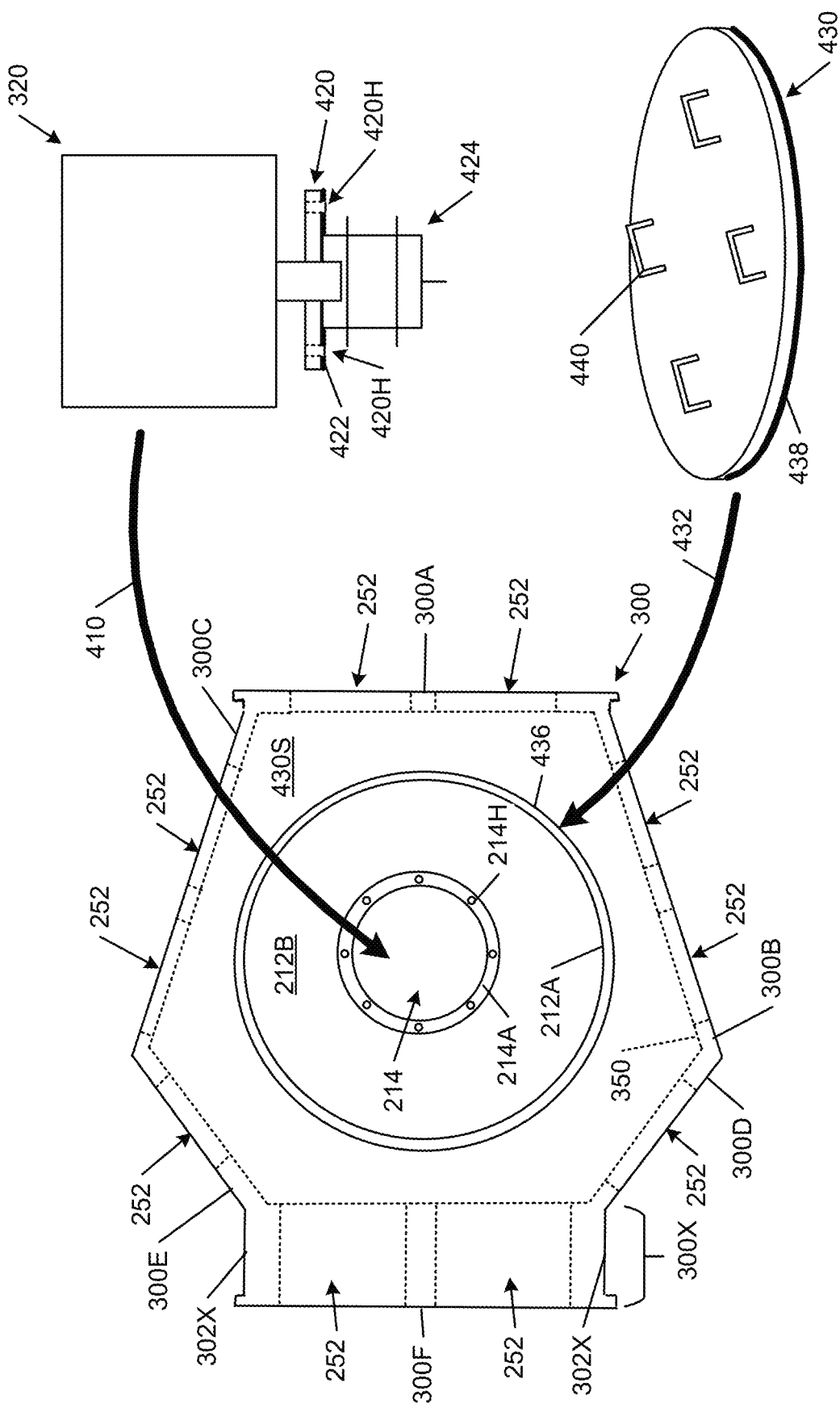
Figure 4C:
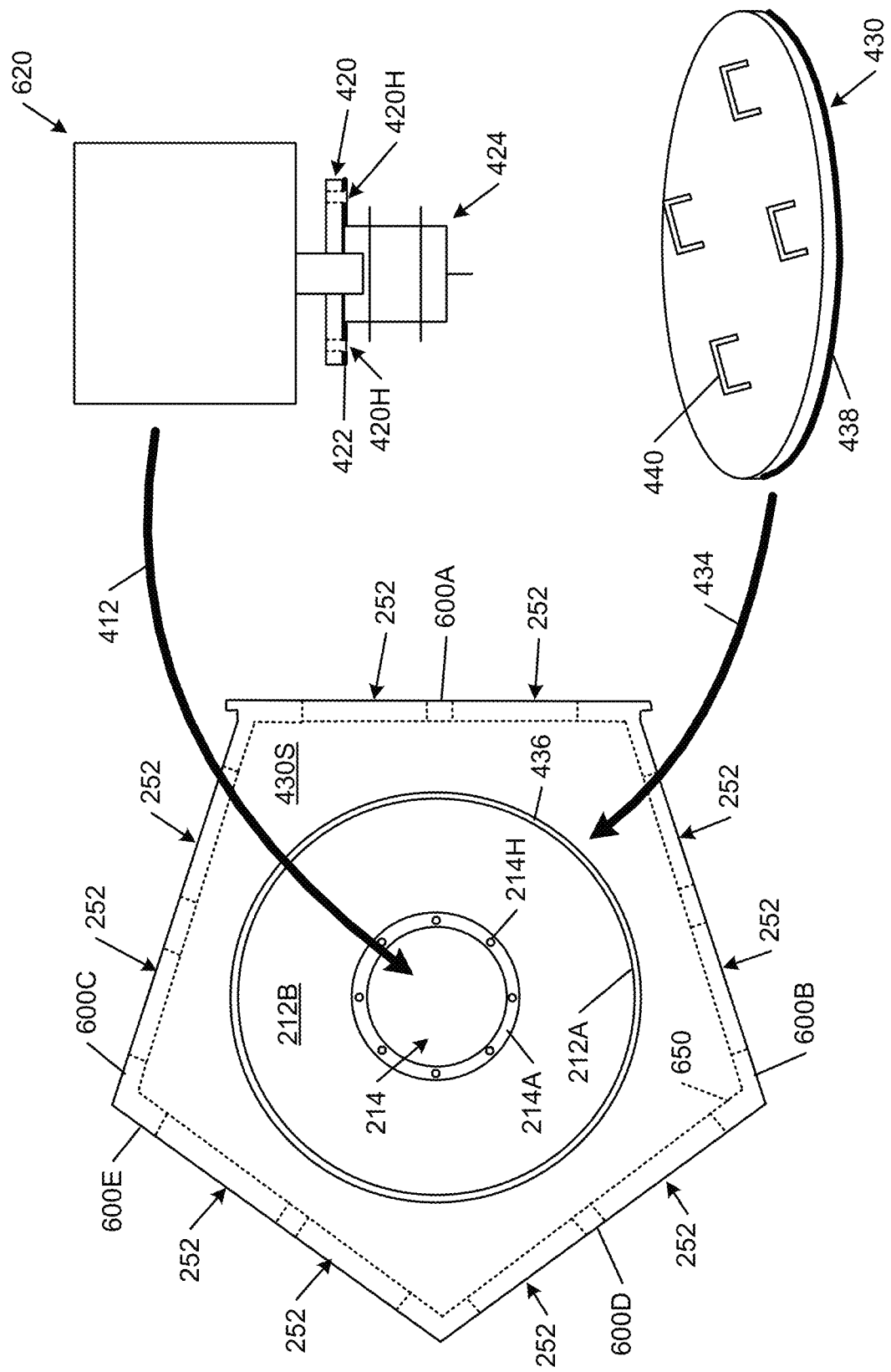

FIG. 1 is a schematic view of an extended, cluster type substrate processing system that may incorporate and/or use aspects of this technology;

FIGS. 2A-2D provide various views of a substrate handling chamber precursor in accordance with some examples of this technology;

FIGS. 3A-3C provide various views illustrating features and use of standard substrate processing chamber precursors in accordance with some examples of this technology; and FIGS. 4A-4C show various features of structures, methods, and assembly of substrate handling chambers in accordance with some examples of this technology.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION

Reference now will be made to the drawings wherein like reference numerals identify similar structural features or aspects of the subject disclosure.

FIG. 1 schematically illustrates an overhead view of a substrate processing system 100 (e.g., a cluster type semiconductor processing system) having expanded substrate processing capabilities in accordance with some examples of this technology. This substrate processing system 100 expands substrate processing capabilities at least by adding an additional substrate handling chamber and one or more additional substrate processing chambers as compared to conventional cluster type semiconductor processing systems. Aspects of the present technology may be used with and/or in the production of substrate processing systems (e.g., a cluster type semiconductor processing systems) having expanded substrate processing capabilities of the types described in U.S. Provisional Patent Appln. No. 63/524,272 filed Jun. 30, 2023 and entitled "Extended Substrate Processing Systems and Methods with Additional Processing Chamber Connectability." U.S. Provisional Patent Appln. No. 63/524,272 is entirely incorporated herein by reference.

As shown in FIG. 1, this example expanded substrate processing system 100 includes: (a) a first substrate handling chamber 300 (an "inboard" substrate handling chamber) including a first robotic arm 320 having an end effector 320A; (b) a first load-lock module 400 (an "inboard" load-lock module) connected at one edge or facet of the first substrate handling chamber 300; (c) a second load-lock module 500 (an "outboard" load-lock module) connected at the opposite edge or facet of the first substrate handling chamber 300; and (d) a second substrate handling chamber 600 (an "outboard" substrate handling chamber) including a second robotic arm 620 having an end effector 620A. The second load-lock module 500 extends between and connects the first substrate handling chamber 300 and the second substrate handling chamber 600. The first load-lock module 400 of this example also is connected with an equipment front end module 700 that includes a third robotic arm 720 having an end effector 720A. The equipment front end module 700 may include or connect with a nitrogen gas source for providing a nitrogen gas atmosphere within the equipment front end module 700. The equipment front end module 700 receives new substrates for processing into the substrate processing system 100 and discharges processed substrates from the substrate processing system 100 via one or more loading ports 800A-800D (moving the substrates between the loading port(s) 800A-800D and the first load-lock module 400 using the robotic arm 720). While four loading ports 800A-800D are shown in the example of FIG. 1, more or fewer loading ports may be provided in other specific examples of this technology.

Each of the first substrate handling chamber 300 and the second substrate handling chamber 600 is connected with multiple substrate processing chambers 900. Substrates are transferred into the substrate processing chambers 900 where one or more layers of material are deposited onto a surface of the substrate and/or other desired substrate processing takes place. FIG. 1 shows each substrate processing chamber 900 including four substrate supports 902 onto which substrates can be placed during processing. More or fewer substrates supports 902 may be provided in the substrate processing chambers 900 (e.g., the substrate processing chambers 900 may be dual chamber modules (DCM) or quad chamber modules (QCM)). Substrate processing chambers 900 in accordance with some examples of this technology may include another four substrate supports 902 located vertically beneath the four substrate supports 902 shown in the top view of FIG. 1. Each of the substrate processing chambers 900 may have the same structures or one or more of the substrate processing chambers 900 may have a different structure from other substrate processing chambers 900 present.

Each of the first substrate handling chamber 300 and the second substrate handling chamber 600 is connected with its respective substrate processing chambers 900 via one or more gate valves 1000. While two gate valves 1000 are shown connecting substrate handling chambers 300, 600 with each of their respective substrate processing chambers 900, more or fewer gate valves 1000 may be provided with each substrate processing chamber 900, in other examples of this technology. Substrate processing chambers 900 in accordance with some examples of this technology may be connected with their respective substrate handling chamber 300, 600 by another two gate valves 1000, e.g., located vertically beneath the two gate valves 1000 shown in the top view of FIG. 1. When closed, the gate valves 1000 sealingly separate the substrate handling chambers 300, 600 from their respective substrate processing chambers 900 (so that independent atmospheric conditions may be maintained in each chamber). When open, the gate valves 1000 provide an opening (e.g., a substrate transfer slot) through which the end effector 320A, 620A of a robotic arm 320, 620 can extend to move substrates into and out of the substrate processing chamber 900. The openings through the gate valves 1000 align with substrate transfer slots provided in the substrate processing chambers 900 and the substrate handling chambers 300, 600, to enable substrates to be moved between the substrate processing chambers 900 and the substrate handling chambers 300, 600 through the gate valves 1000. Each of gate valves 1000 may have the same structures or one or more of the gate valves 1000 may have a different structure from other gate valves 1000 present.

One face of the first load-lock module 400 connects with the equipment front end module 700 by one or more gate valves 1100A (two shown in FIG. 1), and the opposite face of the first load-lock module 400 connects with the first substrate handling chamber 300 by one or more gate valves 1100B (two shown in FIG. 1). The first load-lock module 400 further includes one or more substrate supports 402 (e.g., "setplates," two shown in FIG. 1) for holding substrates while they wait to be moved into the equipment front end module 700 or the first substrate handling chamber 300. When closed, the gate valves 1100A, 1100B sealingly separate the first load-lock module 400 from the equipment front end module 700 and the substrate handling chamber 300 (so that independent atmospheric conditions may be maintained in each chamber). When open, the gate valves 1100A provide an opening (e.g., a substrate transfer slot) through which the end effector 720A of robotic arm 720 can extend to move substrates into and out of the equipment front end module 700. The openings through the gate valves 1100A align with substrate transfer slots provided in the equipment front end module 700 and the first load-lock module 400 to enable substrates to be moved between the equipment front end module 700 and the first load-lock module 400 through gate valves 1100A. When open, the gate valves 1100B provide an opening (e.g., a substrate transfer slot) through which the end effector 320A of robotic arm 320 can extend to move substrates into and out of the substrate handling chamber 300. The openings through the gate valves 1100B align with substrate transfer slots provided in the substrate handling chamber 300 and the first load-lock module 400 to enable substrates to be moved between the substrate handling chamber 300 and the first load-lock module 400 through gate valves 1100B. Each of gate valves 1100A, 1100B may have the same structure or one or more of the gate valves 1100A, 1100B may have a different structure from other gate valves 1100A, 1100B, 1000 present.

In the substrate processing system 100 of FIG. 1, one face of the second load-lock module 500 connects with the first substrate handling chamber 300 by one or more gate valves 1200A (two shown in FIG. 1), and the opposite face of the second load-lock module 500 connects with the second substrate handling chamber 600 by one or more gate valves 1200B (two shown in FIG. 1). The second load-lock module 500 further includes one or more substrate supports 502 (e.g., "setplates," two shown in FIG. 1) for holding substrates while they wait to be moved between the two substrate handling chambers 300, 600. When closed, the gate valves 1200A, 1200B sealingly separate the second load-lock module 500 from the two substrate handling chambers 300, 600 (so that independent atmospheric conditions may be maintained in each chamber). When open, the gate valves 1200A provide an opening (e.g., a substrate transfer slot) through which the end effector 320A of robotic arm 320 can extend to move substrates into and out of the first substrate handling chamber 300. The openings through the gate valves 1200A align with substrate transfer slots provided in the first substrate handling chamber 300 and the second load-lock module 500 to enable substrates to be moved between the substrate handling chamber 300 and the second load-lock module 500 through gate valves 1200A. When open, the gate valves 1200B provide an opening (e.g., a substrate transfer slot) through which the end effector 620A of robotic arm 620 can extend to move substrates into and out of the second substrate handling chamber 600. The openings through the gate valves 1200B align with substrate transfer slots provided in the second substrate handling chamber 600 and the second load-lock module 500 to enable substrates to be moved between the second substrate handling chamber 600 and the second load-lock module 500 through gate valves 1200B. Each of gate valves 1200A, 1200B may have the same structure or one or more of the gate valves 1200A, 1200B may have a different structure from other gate valves 1200A, 1200B present. Gate valves 1200A and/or 1200B also may have the same or different structures from gate valves 1100A and/or 1100B and/or from gate valves 1000.

The first lock-load module 400 may have the same structure as the second load-lock module 500 and/or the first and second load-lock modules 400, 500 may be interchangeable (e.g., so that load-lock modules 400, 500 can switch positions and/or have a modular structure). In other examples, the first lock-load module 400 and the second load-lock module 500 may have different structures and/or may not be interchangeable (e.g., so that load-lock modules 400, 500 cannot switch positions in the substrate processing system 100). Either or both load-lock modules 400, 500 may be multi-station cooling capable and/or path through types.

The substrate processing system 100 described above provides manufacturers and end users with additional flexibility, options, and the potential for increasing production capacity. For example, cluster type substrate processing system manufacturers may provide multiple product line options for customers. As one option, some customers could purchase the entire extended substrate processing system 100 as shown in FIG. 1, i.e., with two substrate handling chambers 300, 600 and two load-lock modules 400, 500. Other customers, however, may not want or need the extended and expanded substrate processing capabilities. Such customers may opt for a less expensive cluster type substrate processing system option in which the inboard substrate handling chamber 300 and one of the load-lock modules 400 or 500 are removed. Such substrate processing system may include: (a) substrate handling chamber 600 connected with (b) up to four substrate processing chambers 900 and connected with (c) one load-lock module 400 or 500, and the load-lock module 400 or 500 is connected with (d) the equipment front end module 700, which is connected with (e) one or more loading ports 800A-800D. Thus, to provide various product line options and to better meet all of its potential customer needs, a substrate processing equipment manufacturer may need to produce more substrate handling chambers 600 than substrate handling chambers 300 (as not all customers will desire the full, extended substrate processing system 100 in the form shown in FIG. 1).

But, as shown in FIG. 1, substrate handling chambers 300, 600 are not interchangeable with one another. The "inboard" substrate handling chamber 300 of this example includes six facets: (a) one long facet 300A connected with first load-lock module 400, (b) two long facets 300B, 300C connected with substrate processing chambers 900, (c) two short facets 300D, 300E that may include a single substrate transfer slot 252 in the facet width direction, and (d) one long facet 300F connected with second load-lock module 500. The "outboard" substrate handling chamber 600 of this example includes five facets: (a) one facet 600A connected with load-lock module 500 and (b) four facets 600B, 600C, 600D, and 600E connected with substrate processing chambers 900. While other options are possible, in the example of FIG. 1, the facets 600A-600E are each substantially equal in their width dimension (the side-to-side dimension).

Despite their differences in overall sizes and shapes, however, in accordance with aspects of the present technology, each of the inboard substrate handling chamber 300 and the outboard substrate handling chamber 600 of this example may be made from a common or standard substrate handling chamber precursor 200. FIGS. 2A-2D provide various views of a standard substrate handling chamber precursor 200 in accordance with aspects of the present technology. This standard precursor 200 can be further machined (as described in more detail below) to form either of inboard substrate handling chamber 300 or outboard substrate handling chamber 600. Thus, a manufacturer (or a supplier to that manufacturer) need only maintain this single type of substrate handling chamber precursor 200 in its inventory, and those substrate handling chamber precursors 200 can be used to make either an inboard substrate handling chamber 300 or an outboard substrate handling chamber 600, depending on the needs of the manufacturer at a given time. These features simplify the manufacturer's inventory for substrate handling chamber precursors, can reduce the overall volume of inventory needed (e.g., by not needing to maintain minimum inventory of two separate precursors), and can help avoid unexpected manufacturing delays by having precursors 200 for both substrate handling chamber 300, 600 structures available. These features also can simplify the manufacturer and/or reduce the tooling needed for making substrate handling chamber precursors 200, because a single set (or a single style) of specific tools (e.g., forging hammers, dies, anvils, etc.) and a single set of manufacturing process steps can be used to make substrate handling chamber precursors 200 for producing two (or more) different types of substrate handling chambers 300, 600.

Figure 2B:
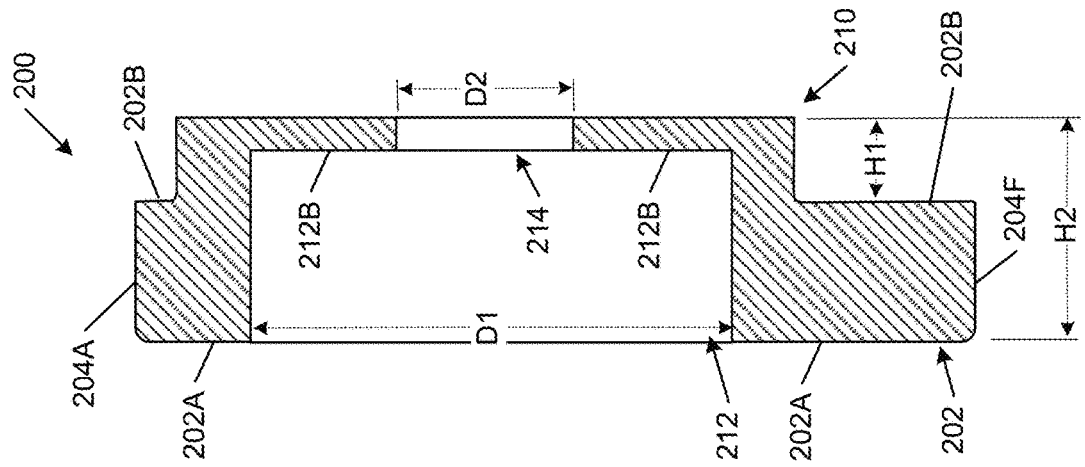
Figure 2A:
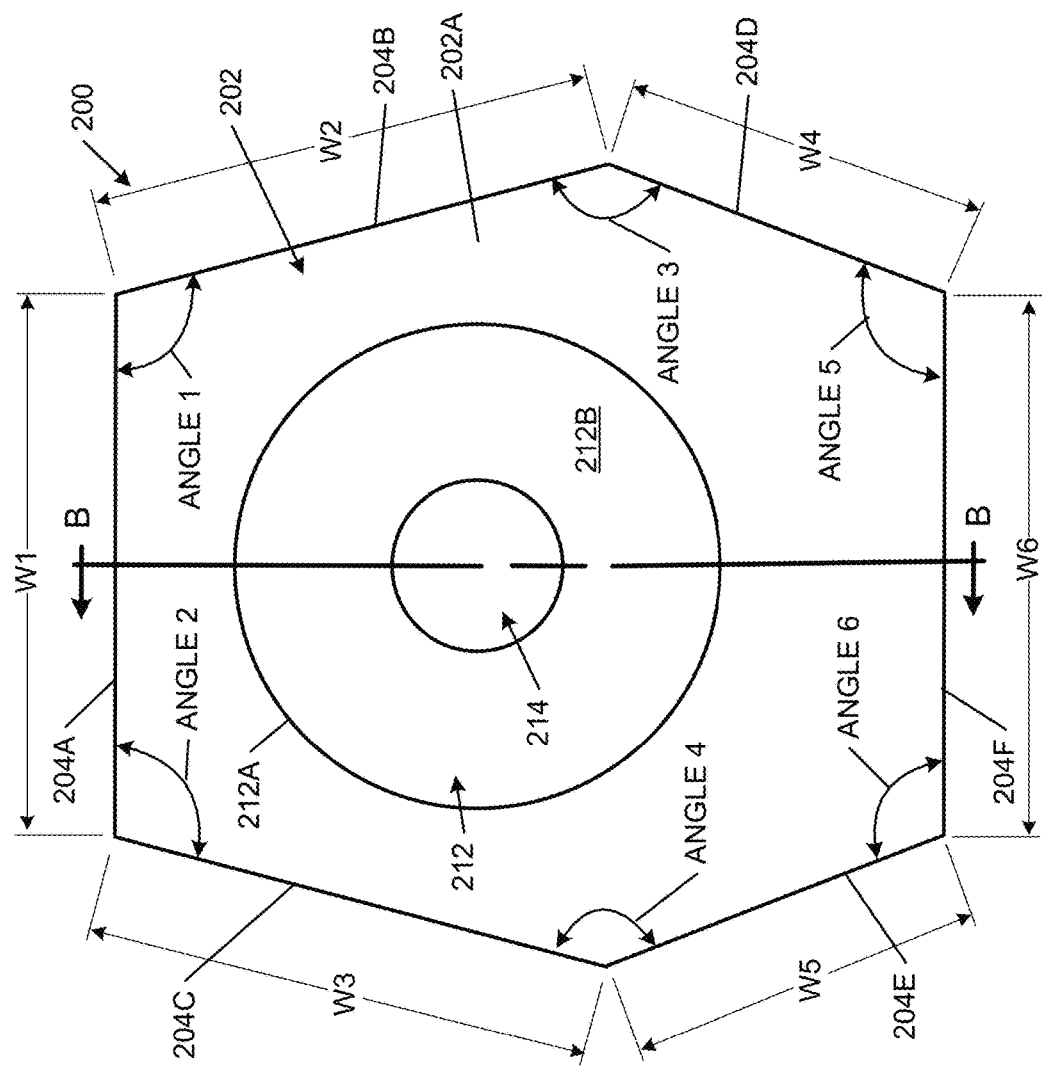
Figure 2C:
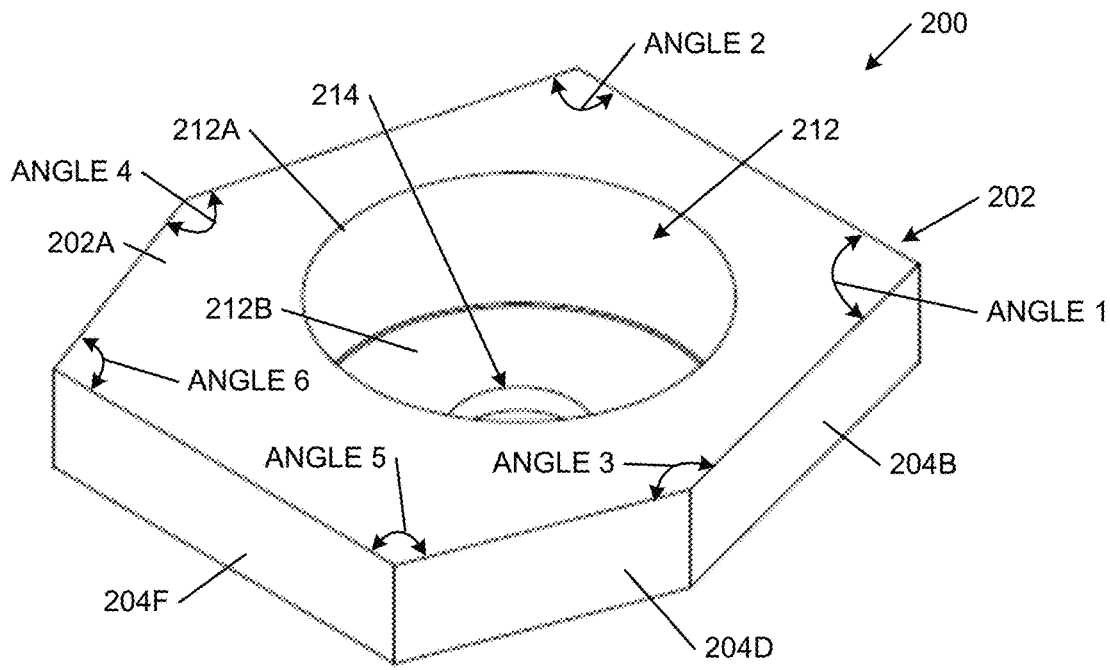
Figure 2D:
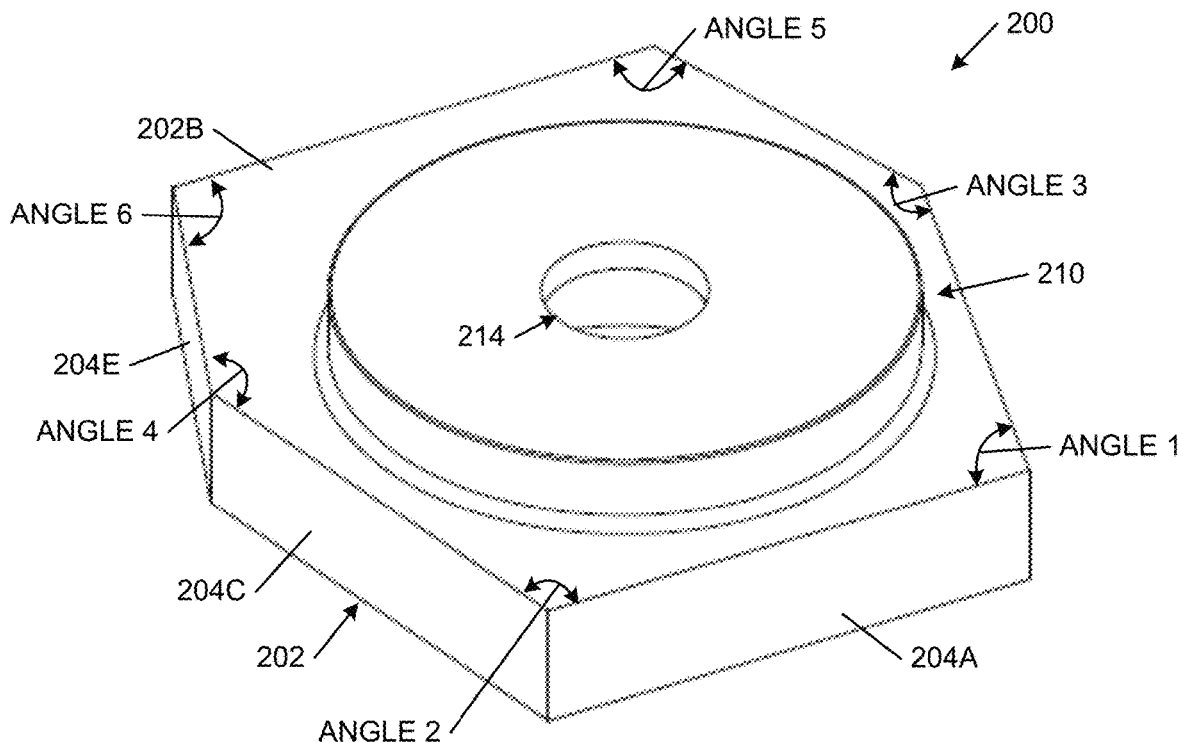

The substrate handling chamber precursor 200 of this example comprises a forging, e.g., as shown in FIGS. 2A-2D. FIG. 2A shows a top view of the precursor 200; FIG. 2B shows a cross-sectional view taken along line B-B in FIG. 2A; FIG. 2C shows a top perspective view; and FIG. 2D shows a bottom perspective view. The substrate handling chamber precursor 200 of FIGS. 2A-2D may be manufactured to the illustrated form by a forging process, e.g., by forging an aluminum or aluminum alloy raw material billet (e.g., aluminum 6061-t6) into the size and shape shown in FIGS. 2A-2D. The example precursor 200 shown in FIGS. 2A-2D may be formed as a single, unitary, one-piece construction.

As shown in FIGS. 2A-2D, this example substrate handling chamber precursor 200 includes a main body portion 202 including a first major surface 202A, a second major surface 202B opposite the first major surface 202A, and multiple facets forming sidewalls between the first major surface 202A and the second major surface 202B. In the specific example of FIGS. 2A-2D, the sidewalls of the substrate handling chamber precursor 200 include: (a) a first facet 204A, (b) a second facet 204B extending at an oblique angle (Angle 1) from the first facet 204A; (c) a third facet 204C extending at an oblique angle (Angle 2) from the first facet 204A; (d) a fourth facet 204D extending at an oblique angle (Angle 3) from the second facet 204B; (e) a fifth facet 204E extending at an oblique angle (Angle 4) from the third facet 204C; and (f) a sixth facet 204F extending between the fourth facet 204D and the fifth facet 204E, extending at an oblique angle (Angle 5) with respect to the fourth facet 204D, and extending at an oblique angle (Angle 6) with respect to the fifth facet 204E. Thus, as shown in FIGS. 2A-2D, the main body portion 202 of the substrate handling chamber precursor 200 may have a hexagonal shape formed by the sidewalls (facets 204A-204F). Also, as shown in FIGS. 2C and 2D, in this illustrated example: (a) the second major surface 202B also has a hexagonal outer perimeter shape, (b) with the same angles for Angle 1 through Angle 6, (c) with the facets 204A-204F extending perpendicular between the first major surface 202A and the second major surface 202B, and (d) with the facets 204A-204F being planar (or substantially planar). Alternatively, if desired, the second major surface 202B could have a different shape from the first major surface 202A and/or different angle measurements (e.g., if the sidewalls formed by facets 204A-204F are not perpendicular from the major surfaces 202A, 202B and/or are not planar).

Additional potential features of the geometry of substrate handing chamber precursors 200 in accordance with at least some examples of this technology include various relative sizing features. For example, in at least some examples of this technology: (a) the first facet 204A and the sixth facet 204F may be substantially equal in width (e.g., $W1 \approx W6$); (b) the second facet 204B and the third facet 204C may be substantially equal in width (e.g., W2≈W3); and (c) the fourth facet 204D and the fifth facet 204E may be substantially equal in width (e.g., W4≈W5). The term "substantially equal" as used herein in the context of a dimensional measurement (such as height, width, length, depth, etc.) means that the two measurements (e.g., widths) being compared are equal or within 5% of each other (e.g., W1=W6± (W6×0.05)). Additionally or alternatively, if desired, in at least some examples of this technology, any two or more of the facets 204A-204F may have a height dimension (into and out of the page of FIG. 2A) that is "substantially equal" to a height dimension of one or more other facets 204A-204F.

In accordance with at least some examples of this technology, the widths W4 and W5 of the fourth facet 204D and the fifth facet 204E, respectively, may be less than the widths W1, W2, W3, and W6 of the other facets 204A, 204B, 204C, and 204F, respectively. Additionally or alternatively, in some examples of this technology, the widths W2 and W3 of the second facet 204B and the third facet 204C, respectively, may be less than or "substantially equal" to the widths W1 and W6 of the first facet 204A and the sixth facet 204F, respectively. In some examples of this technology, at least one of the first facet 204A, the second facet 204B, the third facet 204C, and/or the sixth facet 204F will be at least 1.15 times wider than the fourth facet 204D and/or the fifth facet 204E, and in some examples, at least 1.2 times wider, at least 1.25 times wider, at least 1.3 times wider, or even at least 1.35 times wider. In other words, W1, W2, W3, and/or W6 may be at least 1.15 times W4 and/or W5 (and in some examples, at least 1.2 times, at least 1.25 times, at least 1.3 times, or even at least 1.35 times).

As some additional and/or alternative specific examples, the facets 204A through 204F may have any one or more of the following width features and/or properties:

| | | |
|---|---|---|
| W4 ≤ 0.8 × W1 | W4 ≤ 0.8 × W6 | W4 ≤ 0.8 × W2 |
| W4 ≤ 0.8 × W3 | W5 ≤ 0.8 × W1 | W5 ≤ 0.8 × W6 |
| W5 ≤ 0.8 × W2 | W5 ≤ 0.8 × W3 | W2 ≤ 0.98 × W1 |
| W2 ≤ 0.98 × W6 | W3 ≤ 0.98 × W1 | W3 ≤ 0.98 × W6 |
| W4 ≥ 0.5 × W1 | W4 ≥ 0.5 × W6 | W4 ≥ 0.5 × W2 |
| W4 ≥ 0.5 × W3 | W5 ≥ 0.5 × W1 | W5 ≥ 0.5 × W6 |
| W5 ≥ 0.5 × W2 | W5 ≥ 0.5 × W3 | W2 ≥ 0.9 × W1 |
| W2 ≥ 0.9 × W6 | W3 ≥ 0.9 × W1 | W3 ≥ 0.9 × W6 |
| 0.5 × W1 ≤ W4 ≤ 0.8 × W1 | 0.5 × W6 ≤ W4 ≤ 0.8 × W6 | |
| 0.5 × W1 ≤ W5 ≤ 0.8 × W1 | 0.5 × W6 ≤ W5 ≤ 0.8 × W6 | |
| 0.6 × W1 ≤ W4 ≤ 0.75 × W1 | 0.6 × W6 ≤ W4 ≤ 0.75 × W6 | |
| 0.6 × W1 ≤ W5 ≤ 0.75 × W1 | 0.6 × W6 ≤ W5 ≤ 0.75 × W6 | |
| 0.85 × W1 ≤ W2 ≤ 0.98 × W1 | 0.85 × W6 ≤ W2 ≤ 0.98 × W6 | |
| 0.85 × W1 ≤ W3 ≤ 0.98 × W1 | 0.85 × W6 ≤ W3 ≤ 0.98 × W6 | |
| 0.9 × W1 ≤ W2 ≤ 0.95 × W1 | 0.9 × W6 ≤ W2 ≤ 0.95 × W6 | |
| 0.9 × W1 ≤ W3 ≤ 0.95 × W1 | 0.9 × W6 ≤ W3 ≤ 0.95 × W6 | |

As some more absolute dimensions, the substrate handling chamber precursor 200 may be any desired size, e.g., dependent on the desired size of the final substrate handling chambers 300, 600. In accordance with at least some examples of this technology, W1 and W6 may be within a range of 800 mm to 1500 mm; W2 and W3 may be within a range of 700 mm to 1400 mm; and W4 and W5 may be within a range of 350 mm to 850 mm.

Additional or alternative potential features of the geometry of substrate handing chamber precursors 200 in accordance with at least some examples of this technology include various facet angle features. For example, in at least some examples of this technology: (a) Angle 1 may be substantially equal to Angle 2; (b) Angle 3 may be substantially equal to angle 4; and (c) Angle 5 may be substantially equal to Angle 6. The term "substantially equal" as used herein in the context of angle sizes means that the two angles being compared are equal or within 5 degrees of each other (e.g., Angle 1=Angle 2±5 degrees)). All of Angles 1 through Angle 6 may be obtuse angles. Additionally or alternatively, the substrate handling chamber precursor 200 may be symmetric about a line passing through the center of the first facet 204A and the sixth facet 204F (e.g., symmetric about the section line B-B shown in FIG. 2A).

Substrate handing chamber precursors 200 in accordance with at least some examples of this technology may include any one or more of the following features or properties: (i) Angle 3 and/or Angle 4 may be larger than any one or more of Angle 1, Angle 2, Angle 5, and/or Angle 6; (ii) Angle 3 and/or Angle 4 may be larger than each of Angle 1, Angle 2, Angle 5, and Angle 6; (iii) Angle 5 and/or Angle 6 may be larger than either or both of Angle 1 and/or Angle 2; (iv) Angle 3 and/or Angle 4 may be at least 30 degrees larger than any one or more of Angle 1, Angle 2, Angle 5, and/or Angle 6; (v) Angle 3 and/or Angle 4 may be at least 30 degrees larger than each of Angle 1, Angle 2, Angle 5, and Angle 6; (vi) Angle 5 and/or Angle 6 may be at least 4 degrees larger than either or both of Angle 1 and/or Angle 2; (vii) Angle 3 and/or Angle 4 may be 145 degrees±20 degrees; (viii) Angle 3 and/or Angle 4 may be 145 degrees±10 degrees; (ix) Angle 1 and/or Angle 2 may be 105 degrees±20 degrees; (x) Angle 1 and/or Angle 2 may be 105 degrees±10 degrees; (xi) Angle 5 and/or Angle 6 may be 110 degrees±20 degrees; and/or (xii) Angle 5 and/or Angle 6 may be 110 degrees±10 degrees.

The example substrate handling chamber precursor 200 of FIGS. 2A-2D further includes a projection 210 extending from the second major surface 202B and in a direction away from the first major surface 202A. In this illustrated example, the main body portion 202 and the projection 210 of the substrate handling chamber precursor are formed as a single, unitary one-piece, component part, e.g., during a forging process. A recess 212 is defined extending inward from the first major surface 202A toward the second major surface 202B. In this specific example, the recess 212 extends inward from the first major surface 202A in an area of the main body portion 202 corresponding to the location of the projection 210, e.g., as shown in FIGS. 2A-2C. This recess 212 includes a bottom surface 212B. The recess 212 of this example extends inward beyond a location of the second major surface 202B such that the bottom surface 212B is located within the interior of the projection 210, as shown in FIG. 2B. The recess 212 may form a top opening 212A for the substrate handling chamber 300 or 600 to be formed from the substrate handling chamber precursor 200 and provides an opening for access to an interior chamber of that substrate handling chamber 300 or 600, as will be described in more detail below. The top of the recess 212 around the opening 212A at the first major surface 202A may form (or may be formed into) a seat for engaging a lid (that closes off the interior chamber of the final substrate handling chamber 300, 600 structure).

FIGS. 2B-2D further illustrate that the projection 210 of this example has a cylindrical shape extending downward from the second major surface 202B. While other shapes are possible, the projection 210 of this specific example substrate handling chamber precursor 200 includes a round cylindrical structure (having a round transverse cross-section shape) extending downward from the second major surface 202B. Also, while other shapes are possible, the recess 212 of this specific example substrate handling chamber precursor 200 includes a circular perimeter having a first diameter (D1, see FIG. 2B) at the first major surface 202A and forms a circular, cylindrical recess 212. Projection 210 may have a height dimension H1 that makes up about 25% to 50% (and in some examples, 30% to 45%) of an overall height dimension H2 of the substrate handling chamber precursor 200. See FIG. 2B.

Additionally, the substrate handling chamber precursor 200 of this illustrated example further includes a through hole opening 214 extending from the bottom surface 212B of the recess 212 and through the projection 210 to open at the bottom of the precursor 200. The bottom surface 212B of the recess 212 around the through hole opening 214 may form (or may be formed into) a seat for mounting a robotic arm 320 or 620 in the final substrate handling chamber 300, 600. As will be described in more detail below in conjunction with FIGS. 4A-4C, a lip of a mounting area for the robotic arm 320, 620 may engage the area of the bottom surface 212B around the through hole opening 214 and the motor (and/or other portion) of the robotic arm 320, 620 may extend into the through hole opening 214 below the bottom surface 212B.

Also, while other shapes are possible, the through hole opening 214 of this specific example substrate handling chamber precursor 200 includes a circular perimeter having a second diameter (D2, see FIG. 2B), e.g., at the bottom surface 212B of the recess 212. In at least some examples of this technology, D2 may be less than one half of D1 (i.e., D2≤0.5×D1 (and in some examples, less than 0.45×D1 or even less than 0.4×D1)). As some absolute dimensions: (a) D1 may be less than 1000 mm (and in some examples, less than 900 mm) and/or greater than 600 mm (and in some examples, greater than 750 mm); and/or (b) D2 may be less than 500 mm (and in some examples, less than 400 mm) and/or greater than 200 mm (and in some examples, greater than 300 mm).

FIGS. 3A-3C show top views of example substrate handling chamber precursors 200 in solid lines with the outline of final substrate handling chambers 300, 600 to be formed from the precursors 200 shown in broken lines. In this manner, FIG. 3A shows how the outboard substrate handling chamber 600 can be formed from a substrate handling chamber precursor 200 and FIG. 3B shows how the inboard substrate handling chamber 300 can be formed from a substrate handling chamber precursor 200 of the same size, shape, dimensions, etc. FIG. 3C shows the outlines of both the inboard substrate handling chamber 300 (in dot-dash lines) and the outboard substrate handling chamber 600 (in broken lines) superimposed on a single substrate handling chamber precursor 200 outline (in solid lines), to show the overlapping nature, the similarities, and the differences in shapes for these example products.

As shown in FIG. 3A, to create the outboard substrate handling chamber 600, the exterior surface of a substrate handling chamber precursor 200 is machined to remove material at the fourth facet 204D, the fifth facet 204E, and the sixth facet 204F to create facet 600D and facet 600E of the substrate handling chamber 600. Additionally, in this example, some machining occurs at the second facet 204B and third facet 204C of the substrate handling chamber precursor 200 to form the second facet 600B and third facet 600C of the substrate handling chamber 600. The first facet 204A of the substrate handling chamber precursor 200 of this illustrated example is formed to substantially match up with the first facet 600A of the outboard substrate handling chamber 600.

In at least some examples of this technology, the angles β defined between adjacent facets 600A-600E of the outboard substrate handling chamber 600 may be "substantially equal" to one another, e.g., such that the facets 600A-600E substantially form a regular pentagon. But other angular arrangements for the facets 600A-600E of an outboard substrate handling chamber 600 are possible in other specific examples of this technology.

As shown in FIG. 3B, to create the inboard substrate handling chamber 300, the exterior surface of a substrate handling chamber precursor 200 is machined to remove material at the fourth facet 204D and at the fifth facet 204E to create the shorter fourth facet 300D and the shorter fifth facet 300E and to create an extension region 300X of the substrate handling chamber 300. The extension region 300X provides some additional length in the substrate transfer axis direction A of the substrate handling chamber 300, e.g., to allow more room in the final assembled substrate processing system 100 (see FIG. 1) to access facets 300D and 300E. The extension region 300X can help provide additional room to allow a substrate processing chamber or other equipment 910 to be mounted to facets 300D and 300E of substrate handling chamber 300, e.g., as shown in broken lines in FIG. 1, to provide even further expanded capabilities.

Aspects of this technology additionally relate to substrate handling chambers of the types described herein, e.g., in which the substrate handling chamber includes multiple facets (e.g., of the types described above in conjunction with FIG. 3B) in which one facet (e.g., facet 300F) is offset from other facets (e.g., 300A-300E) by an extended section (e.g., extension region 300X). FIG. 3B shows substrate handling chamber 300 including: (a) a first facet 300A, (b) a second facet 300B extending at an oblique angle (Angle AB) from the first facet 300A; (c) a third facet 300C extending at an oblique angle (Angle AC) from the first facet 300A; (d) a fourth facet 300D extending at an oblique angle (Angle BD) from the second facet 300B; and (e) a fifth facet 300E extending at an oblique angle (Angle CE) from the third facet 300C. The extension region 300X extends outward from the fourth facet 300D and the fifth facet 300E, e.g., in a substrate transfer axis direction A and/or in a length direction L (the direction from the first facet 300A to the sixth facet 300F). The extension region 300X of this example is formed by parallel sidewalls 302X of the substrate handling chamber 300 that extend from the fourth facet 300D and fifth facet 300E to a sixth facet 300F. In some examples of this technology, the parallel sidewalls 302X forming the extension region 300X may be substantially perpendicular (e.g., ±5 degrees) to the sixth facet 300F. Angle AB may be substantially equal to angle AC and/or Angle BD may be substantially equal to Angle CE. Additionally or alternatively, if desired, the first facet 300A and the sixth facet 300F may have substantially equal widths; the second facet 300B and the third facet 300C may have substantially equal widths; and/or the fourth facet 300D and the fifth facet 300E may have substantially equal widths (with these "widths" corresponding to the dimensional directions for the widths W1 to W6 as generally shown in FIG. 2A (horizontal, side-to-side directions across facets)). The opposite sidewalls 302X of the extension region 300X also may have substantially equal widths W7 (see FIG. 3B).

Extension region 300X may be any desired size and/or shape. In some examples, the extension region 300X may form at least 5% of a length dimension L between the first facet 300A and the sixth facet 300F, and in some examples, at least 8%, at least 10%, at least 12%, or even at least 15% of the length L). Additionally or alternatively, in some examples, the extension region 300X may form less than 30% of a length dimension L between the first facet 300A and the sixth facet 300F, and in some examples, less than 25%, or even less than 20% of the length L).

Additionally, in this example, some machining occurs at the second facet 204B and third facet 204C of the substrate handling chamber precursor 200 to form the second facet 300B and third facet 300C of the substrate handling chamber 300. The first facet 204A of the substrate handling chamber precursor 200 of this illustrated example is formed to substantially match up with the first facet 300A of the inboard substrate handling chamber 300. Similarly, the sixth facet 204F of the substrate handling chamber precursor 200 of this illustrated example is formed to substantially match up with the sixth facet 300F of the inboard substrate handling chamber 300.

FIG. 3C shows a top view with the outline of both the inboard substrate handling chamber 300 and the outboard substrate handling chamber 600 superimposed on the outline of the substrate handling chamber precursor 200. This view enables a direct comparison of the material to be removed from a substrate handling chamber precursor 200 to form each of the inboard substrate handling chamber 300 and the outboard substrate handling chamber 600. As evident from FIG. 3C, while both substrate handling chambers 300, 600 may be formed from a commonly sized and shaped precursor 200 (also called a "standard" precursor 200 herein), the outboard substrate handling chamber 600 has fewer facets located around and forming its exterior perimeter shape and sidewalls (e.g., 5 facets in this illustrated example) than the number of facets located around and forming the exterior perimeter shape and sidewalls of the inboard substrate handling chamber 300 (e.g., at least 6 facets in this illustrated example). Additionally or alternatively, as also evident from FIG. 3C, more material (e.g., a greater volume of material) is removed from a standard precursor 200 to form the outboard substrate handling chamber 600 than is removed from a standard precursor 200 to form the inboard substrate handling chamber 300. As shown in FIG. 3C, the inboard substrate handling chamber 300 has a larger "footprint" from the top view than the outboard substrate handling chamber 600.

As also evident from FIG. 3C, in this illustrated example, the first facet 300A, second facet 300B, and third facet 300C of the inboard substrate handling chamber 300 match (or substantially match) the size and/or shape of the first facet 600A, second facet 600B, and third facet 600C of the outboard substrate handling chamber 600. The precursor 200 may be sized and shaped such that little to no machining may be needed at the first major surface 202A, the second major surface 202B, and/or the projection 210 when forming a precursor 200 into the inboard substrate handling chamber 300 and/or into the outboard substrate handling chamber 600. Thus, in at least some examples of this technology, the final inboard substrate handling chamber 300 and/or the final outboard substrate handling chamber 600 may include the projection 210 structure extending outward from a main body portion of the substrate handling chamber 300, 600 that includes the facets 300A-300F (and extension region 300X) or the facets 600A-600E.

FIGS. 4A-4C illustrate additional features of substrate handling chambers, systems, and methods in accordance with examples of this technology. FIG. 4A provides a flow chart of methods in accordance with some aspects of this technology. At step S400, the method includes providing or accessing an inventory of "standard" substrate handling chamber precursors 200, e.g., plural substrate handling chamber precursors having a standard size and shape. More specifically, the "inventory" may include plural substrate handling chamber precursors 200 (e.g., of the types shown and described above in conjunction with FIGS. 2A-2D) in which each substrate handling chamber precursor 200 has a set of dimensions and features (e.g., height, width, depth, size, shape, features (e.g., projections 210, recesses 212, through hole openings 214, etc.)) that is substantially equal to the sets of dimensions and feature present in other substrate handling chamber precursors 200 of the inventory. In this manner, all of the standard substrate handling chamber precursors 200 in the inventory may be substantially equivalent in size and shape. The terms "providing" a substrate handling chamber precursor and/or "providing" an inventory, as used herein in this context, mean that a party in some manner makes the substrate handling chamber precursor(s) 200 and/or inventory available for use in forming substrate handling chamber 300, 600 products. "Providing" may include, but is not limited to: purchasing substrate handling chamber precursor(s) 200 (e.g., directly or as part of an order for purchasing a final substrate handling chamber product); ordering substrate handling chamber precursor(s) 200 for delivery to another (e.g., a vendor for machining the precursor(s) 200); shipping substrate handling chamber precursor(s) 200 to another; storing substrate handling chamber precursor(s) 200 for future use; retrieving substrate handling chamber precursor(s) 200 from a storage facility or inventory; transmitting a product order to a vendor where fulfillment of that order will include use of substrate handling chamber precursor(s) 200; and the like.

When orders for a substrate processing system 100 or individual substrate handling chambers 300, 600 are received, a manufacturer then may machine a first substrate handling chamber precursor 200 to remove an amount of material from that substrate handling chamber precursor 200 to form an inboard substrate handling chamber 300 body at S402. Machining of this type may include CNC milling and/or other process steps to form the inboard substrate handling chamber 300 body to include an exterior perimeter shape having a first number of facets (e.g., at least six facets) located around and forming sidewalls of the inboard substrate handling chamber 300 body, e.g., as shown in FIG. 3B. The exterior perimeter shape of the inboard substrate handling chamber 300 body also may be formed to include the extension region 300X shown in FIG. 3B. At Step S404, the manufacturer then may machine a second substrate handling chamber precursor 200 to remove an amount of material from that substrate handling chamber precursor 200 to form an outboard substrate handling chamber 600. Machining of this type may include CNC milling and/or other process steps to form the outboard substrate handling chamber 600 body to include an exterior perimeter shape having a second number of facets located around and forming sidewalls of the outboard substrate handling chamber 600 body, e.g., as shown in FIG. 3A. As described above and as evident from FIGS. 3A-3C, the second number of facets (e.g., no more than five facets) for the outboard substrate handling chamber 600 may differ from the first number of facets formed in the inboard substrate handling chamber 300 (e.g., at least six facets). Also, the amount (e.g., volume) of material removed from the precursor 200 to form the outboard substrate handling chamber 600 may be greater than the amount (e.g., volume) of material removed from the precursor 200 to form the inboard substrate handling chamber 300.

Steps S402 and S404 may include features of forming the final inboard substrate handling chamber 300 body and the outboard substrate handling chamber 600 body in addition to the steps for forming the exterior shapes of these chambers 300, 600. As discussed above, substrate handling chambers 300, 600 include an interior chamber in which robotic arms 320, 620, respectively, are mounted and substrate transfer slots through which substrates are moved to other components. The substrate handling chamber precursor 200 of this example, includes recess 212 that forms an opening 212A at the first major surface 202A. Formation of the substrate handling chamber 300, 600 bodies may include further action (e.g., machining, such as CNC milling) to form the remainder of the substrate handling chamber 300, 600 bodies. For example, as shown in FIG. 4B (and optionally as part of Step S402), starting at the sidewall of recess 212, the interior of the substrate handling chamber precursor 200 can be hollowed out to form interior chamber 350 (with its interior sidewalls shown as broken lines in the top view of FIG. 4B). Further, substrate transfer slots 252 can be formed (machined, such as by CNC milling) in the facets 300A-300F so that substrates can be moved from the interior chamber 350 of the substrate handling chamber 300 to other equipment engaged with the substrate handling chamber 300. The facets 300A-300F provide faces for engaging gate valves and/or other equipment, e.g., as shown in FIG. 1. Additionally, as shown in FIG. 4C (and optionally as part of Step S404), starting at the sidewall of recess 212, the interior of the substrate handling chamber precursor 200 can be hollowed out to form interior chamber 650 (with its interior sidewalls shown as broken lines in the top view of FIG. 4C). Further, substrate transfer slots 252 can be formed (machined, such as by CNC milling) in the facets 600A-600E so that substrates can be moved from the interior chamber 650 of the substrate handling chamber 600 to other equipment engaged with the substrate handling chamber 600. The facets 600A-600E provide faces for engaging gate valves and/or other equipment, e.g., as shown in FIG. 1. Any desired number of substrate transfer slots 252 can be formed in the individual facets 300A-300F and the individual facets 600A-600E, including, for example, one or more of: (a) one substrate transfer slot 252 per facet (e.g., in one or more of facets 300D and 300E); (b) two vertically spaced substrate transfer slots 252 per facet (e.g., in one or more of facets 300D and 300E); (c) two horizontally spaced substrate transfer slots 252 per facet (e.g., in one or more of facets 300A-300C, 300F, and 600A-600E); and/or (d) four spaced substrate transfer slots 252 per facet in a 2×2 matrix (e.g., in one or more of facets 300A-300C, 300F, and 600A-600E); etc.

FIGS. 4A-4C show additional potential features of substrate processing systems 100, substrate handling chambers 300, 600, and methods in accordance with aspects of this technology. FIG. 4A includes Step S406 of mounting a substrate handling chamber robot in the substrate handling chambers 300, 600. FIG. 4B illustrates insertion of robotic arm 320 and its associated components in substrate handling chamber 300 (arrow 410) and FIG. 4C illustrates insertion of robotic arm 620 and its associated components in substrate handling chamber 600 (arrow 412). The steps of forming the substrate handling chambers 300, 600 may include, if necessary, machining or other action around the through hole opening 214 to form structure for mounting the robotic arm 320, 620, respectively. As shown in FIGS. 4B and 4C, this may include forming a recessed seating area 214A around the through hole opening 214 and/or forming one or more holes 214H (e.g., for bolts or other fasteners) through bottom surface 212B of the substrate handling chamber 300, 600 body. Robotic arms 320, 620 may include a retaining element 420 sized and shaped to fit over the through hole opening 214 and, when present, fit into the recessed seating area 214A at the bottom of substrate handling chambers 300, 600. The retaining element 420 may include one or more openings 420H configured to align with corresponding holes 214H located at the bottom surface of the substrate handling chamber 300, 600 body. The bottom of the retaining element 420 and/or the exposed surface around the through hole opening 214 (e.g., in recessed seating area 214A) may include a seal 422. The retaining element 420 of robotic arm 320, 620 may be mounted around the through hole opening 214 and fastened (and sealed) in place, e.g., using bolts extending through holes 214H and 420H and/or other desired type of fastener(s).

When mounted, a portion of the robotic arm 320, 620 system may extend into and/or through the through hole opening 214, e.g., to a location below the bottom surface of the substrate handling chamber 300, 600 (e.g., below the bottom of the projection 210). In these illustrated examples, the motor 424 of the robotic arm 320, 620 will extend to a location outside of the interior chamber 350, 650 of the substrate handling chamber 300, 600, respectively. This may make the motor 424 accessible from outside the substrate handling chamber 300, 600.

FIG. 4A also includes Step S408 of mounting a lid 430 to the substrate handling chambers 300, 600. FIG. 4B illustrates mounting of lid 430 over the opening 212A at the top surface 430S of substrate handling chamber 300 (arrow 432), and FIG. 4C illustrates mounting of lid 430 over the opening 212A at the top surface 430S of substrate handling chamber 600 (arrow 434). The top surface 430S of the substrate handling chamber(s) 300, 600 may correspond to a portion of the first major surface 202A of the precursor 200. If necessary or desired, an area around the perimeter of the opening 212A at the top surface 430S of the substrate handling chamber(s) 300, 600 may be machined or otherwise constructed, e.g., to form a lid seating area 436 or recess. The bottom of the lid 430 and/or the exposed surface around the opening 212A may include a seal 438 so that the lid 430 is capable of sealing off the opening 212A. Additional fasteners may be provided to fix the lid 430 in place over the opening 212A.

FIGS. 4B and 4C further show the lid 430 including one or more handle elements 440. The handle elements 440 may be manually engaged to move the lid 430 onto and off of the top surface 430A of the substrate handling chamber(s) 300, 600 and over opening 212A. Alternatively, one or more handle elements 440 (or other suitable structures) may be provided to engage a system for moving the lid 430 (e.g., for engaging a hoist mounted on a gantry, etc.). As yet other examples, if desired, the lid 430 may be provided as part of lid moving systems and methods of the types described in U.S. Provisional Patent Appln. No. 63/526,759 filed Jul. 14, 2023 and entitled "Lid Moving Systems and Methods for Chambers or Containers." U.S. Provisional Patent Appln. No. 63/526,759 is entirely incorporated herein by reference.

In at least some examples of this technology, the substrate handling chamber precursors 200 will be formed in a size and shape (e.g., during forging) such that much of it will not be needed to be further machined (or subject to relatively minor machining) in making the substrate handling chambers 300, 600. For example, when making inboard substrate handling chamber 300, the final substrate handling chamber 300's top surface 430A, bottom surface, first facet 300A and sixth facet 300F may correspond to the first major surface 202A, the second major surface 202B, first facet 204A, and sixth facet 204F, respectively, of a precursor 200 from which it was formed (e.g., with little or no further machining or alterations). Additionally, in some examples, the projection 210, through hole opening 214, and bottom surface 212B of the recess 212 from the precursor 200 may remain in the substrate handling chamber 300 final product (e.g., with little or no further machining or alterations). Additionally or alternatively, when making outboard substrate handling chamber 600, the final substrate handling chamber 600's top surface 430A, bottom surface, and first facet 600A may correspond to the first major surface 202A, the second major surface 202B, and first facet 204A, respectively, of a precursor 200 from which it was formed (e.g., with little or no further machining or alterations). Additionally, in some examples, the projection 210, through hole opening 214, and bottom surface 212B of the recess 212 from the precursor 200 may remain in the substrate handling chamber 600 final product (e.g., with little or no further machining or alterations). These features help reduce the additional machining and steps needed to form the final substrate handling chambers 300, 600 from the precursors 200.

As described above, advantageous aspects of this technology relate to the fact that, despite differences in overall sizes and shapes, each of the inboard substrate handling chamber 300 and the outboard substrate handling chamber 600 may be made from a standard substrate handling chamber precursor 200. Thus, a manufacturer (or a supplier to that manufacturer) need only maintain this single type of substrate handling chamber precursor 200 in its inventory, and those substrate handling chamber precursors 200 can be used to make either of an inboard substrate handling chamber 300 or an outboard substrate handling chamber 600, depending on the needs of the manufacturer at a given time. These features simplify the manufacturer's inventory for substrate handling chamber precursors, can reduce the overall volume of the inventory (by not needing to maintain minimum inventory of two separate precursors), and can help avoid unexpected manufacturing delays by having precursors for both substrate handling chamber 300, 600 structures available. These features also can help reduce the tooling needed for making substrate handling chamber precursors 200, because a single set (or a single style) of specific tools (e.g., forging hammers, dies, anvils, etc.) can be used to make substrate handling chamber precursors 200 for producing two different types of substrate handling chambers 300, 600. Also, these features can simplify the manufacture of precursors 200 by requiring only one method and procedure for making precursors 200 for multiple styles of substrate handling chambers 300, 600.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A method of manufacturing substrate handling chambers, comprising:
providing a first substrate handling chamber precursor and a second substrate handling chamber precursor, the first substrate handling chamber precursor having a first set of dimensions and the second substrate handling chamber precursor having a second set of dimensions that are substantially equal to corresponding dimensions of the first set of dimensions such that the first substrate handling chamber precursor and the second substrate handling chamber precursor are substantially equivalent in size and shape;
machining the first substrate handling chamber precursor to remove a first amount of material from the first substrate handling chamber precursor to form a first substrate handling chamber body, wherein the first substrate handling chamber body includes a first exterior perimeter shape having a first number of facets located around and forming first sidewalls of the first substrate handling chamber body; and
machining the second substrate handling chamber precursor to remove a second amount of material from the second substrate handling chamber precursor to form a second substrate handling chamber body, wherein the second substrate handling chamber body includes a second exterior perimeter shape having a second number of facets located around and forming second sidewalls of the second substrate handling chamber body, wherein the second number of facets is less than the first number of facets, and wherein the second amount of material is greater than the first amount of material.

2. The method according to claim 1, wherein each of the first substrate handling chamber precursor and the second substrate handling chamber precursor has a main body portion including a first major surface, a second major surface opposite the first major surface, and multiple facets forming sidewalls extending between the first major surface and the second major surface.

3. The method according to claim 2, wherein each of the first substrate handling chamber precursor and the second substrate handling chamber precursor further includes a projection extending from the second major surface and in a direction away from the first major surface, wherein the main body portion and the projection are formed as a single, one-piece, forged component part.

4. The method according to claim 3, wherein each of the first substrate handling chamber precursor and the second substrate handling chamber precursor further includes a first recess extending inward from the first major surface, the first recess including a bottom surface.

5. The method according to claim 4, wherein each of the first substrate handling chamber precursor and the second substrate handling chamber precursor further includes a through hole opening extending from the bottom surface of the first recess through the projection.

6. The method according to claim 5, wherein the first recess defines a circular perimeter having a first diameter and the through hole opening defines a circular perimeter having a second diameter, and wherein the second diameter is less than one half the first diameter.

7. The method according to claim 3, wherein the projection of each of the first substrate handling chamber precursor and the second substrate handling chamber precursor comprises a round cylindrical structure extending from the second major surface.

8. The method according to claim 1, wherein each of the first substrate handling chamber precursor and the second substrate handling chamber precursor includes: (a) a first facet, (b) a second facet extending from the first facet at a first angle, (c) a third facet extending from the first facet at a second angle, (d) a fourth facet extending from the second facet at a third angle, (e) a fifth facet extending from the third facet at a fourth angle, and (f) a sixth facet extending between the fourth facet and the fifth facet.

9. The method according to claim 8, wherein the second angle is substantially equal to the first angle and the third angle is substantially equal to the fourth angle.

10. The method according to claim 9, wherein the sixth facet extends from the fourth facet at a fifth angle, wherein the sixth facet extends from the fifth facet at a sixth angle, and wherein the fifth angle is substantially equal to the sixth angle.

11. The method according to claim 10, wherein the third angle is at least 30 degrees larger than the first angle and/or at least 30 degrees larger than the fifth angle.

12. The method according to claim 8, wherein each of the first facet and the sixth facet is wider than each of the second facet, the third facet, the fourth facet, and the fifth facet.

13. The method according to claim 8, wherein each of the first facet, the second facet, the third facet, and the sixth facet is at least 1.3 times wider than each of the fourth facet and the fifth facet.

14. The method according to claim 1, wherein the first number of facets forming the first sidewalls of the first substrate handling chamber body comprises at least six facets, and wherein the second number of facets forming the second sidewalls of the second substrate handling chamber body comprises no more than five facets.

15. The method according to claim 1, wherein the first substrate handling chamber precursor and the second substrate handling chamber precursor are provided as part of an inventory of precursors provided for forming multiple substrate handling chamber bodies, wherein each precursor of the inventory includes a set of dimensions that are substantially equal to corresponding dimensions of the first set of dimensions such that all precursors in the inventory have substantially equivalent sizes and shapes.

16. The method according to claim 1, wherein the first substrate handling chamber body is formed to include: (a) a first top surface, (b) a first bottom surface located opposite the first top surface, and (c) a first chamber extending inward from the first top surface, and wherein the method further comprises: engaging a first lid with the first substrate handling chamber body, wherein the first lid is sized, shaped, and movably positionable to cover a first opening to the first chamber at the first top surface; and/or wherein the second substrate handling chamber body is formed to include: (a) a second top surface, (b) a second bottom surface located opposite the second top surface, and (c) a second chamber extending inward from the second top surface, and wherein the method further comprises: engaging a second lid with the second substrate handling chamber body, wherein the second lid is sized, shaped, and movably positionable to cover a second opening to the second chamber at the second top surface.

17. The method according to claim 1, wherein the first substrate handling chamber body is formed to include: (a) a first top surface, (b) a first bottom surface located opposite the first top surface, (c) a first chamber extending inward from the first top surface to a first interior bottom face, and (d) a first through hole opening extending from the first interior bottom face to the first bottom surface, and wherein the method further comprises: placing a first substrate transfer robot in the first chamber such that a first portion of the first substrate transfer robot extends into the first through hole opening below the first interior bottom face; and/or wherein the second substrate handling chamber body is formed to include: (a) a second top surface, (b) a second bottom surface located opposite the second top surface, (c) a second chamber extending inward from the second top surface to a second interior bottom face, and (d) a second through hole opening extending from the second interior bottom face to the second bottom surface, and wherein the method further comprises: placing a second substrate transfer robot in the second chamber such that a second portion of the second substrate transfer robot extends into the second through hole opening below the second interior bottom face.

* * * * *